United States Patent
Nakao

(10) Patent No.: US 9,966,185 B2
(45) Date of Patent: May 8, 2018

(54) ELECTRONIC DEVICE

(71) Applicant: KYOCERA CORPORATION, Kyoto (JP)

(72) Inventor: Masaki Nakao, Daito (JP)

(73) Assignee: KYOCERA CORPORATION, Kyoto (JP)

( * ) Notice: Subject to any disclaimer, the term of this patent is extended or adjusted under 35 U.S.C. 154(b) by 0 days. days.

(21) Appl. No.: 15/271,889

(22) Filed: Sep. 21, 2016

(65) Prior Publication Data

US 2017/0011839 A1     Jan. 12, 2017

Related U.S. Application Data

(63) Continuation of application No. PCT/JP2015/059296, filed on Mar. 26, 2015.

(30) Foreign Application Priority Data

Mar. 26, 2014 (JP) ................................ 2014-064188

(51) Int. Cl.
    *H01F 27/28*     (2006.01)
    *H05K 1/02*     (2006.01)
    (Continued)

(52) U.S. Cl.
    CPC ....... *H01F 27/2804* (2013.01); *H01F 27/245* (2013.01); *H01F 27/365* (2013.01); *H01F 38/14* (2013.01); *H04M 1/03* (2013.01); *H05K 1/0216* (2013.01); *H05K 1/18* (2013.01); *H05K 2201/10371* (2013.01)

(58) Field of Classification Search
    CPC .... H01F 27/28; H01F 27/2804; H01F 27/245; H01F 27/365; H01F 38/14; H05K 1/18; H05K 1/181
    See application file for complete search history.

(56) References Cited

U.S. PATENT DOCUMENTS 8,421,574 B2    4/2013   Suzuki et al.
2010/0181842 A1*   7/2010   Suzuki .................... H02J 5/005
                                                              307/104

FOREIGN PATENT DOCUMENTS

JP     2008-294385     12/2008
JP     2010-171740     8/2010
(Continued)

OTHER PUBLICATIONS

International Search Report in International Application No. PCT/JP2015/059296, dated Jun. 2, 2015, in 2 pages.
(Continued)

*Primary Examiner* — Timothy Thompson
*Assistant Examiner* — Amol Patel
(74) *Attorney, Agent, or Firm* — Duane Morris LLP

(57) ABSTRACT

An electronic device is disclosed. An electronic device comprises a first magnetic sheet, a coil, and a board. The first magnetic sheet has a first surface and a second surface opposite to the first surface. The coil is located on the first surface. The board has a third surface facing the second surface and has a first component on the third surface. The first magnetic sheet has a through hole that penetrates therethrough from the first surface to the second surface in a region of the first surface, the region being surrounded by the coil. The first component has a first portion facing the through hole.

6 Claims, 14 Drawing Sheets

(51) Int. Cl.
*H05K 1/18* (2006.01)
*H01F 27/245* (2006.01)
*H01F 38/14* (2006.01)
*H04M 1/03* (2006.01)
*H01F 27/36* (2006.01)

(56) References Cited

FOREIGN PATENT DOCUMENTS

| JP | 2010171740 A | * | 8/2010 |
| JP | 2012209997 | | 10/2012 |

OTHER PUBLICATIONS

Written Opinion of the International Searching Authority in International Application No. PCT/JP2015/059296, dated Jun. 2, 2015, and Statement of Relevance of Non-English References Cited Therein, in 5 pages.

\* cited by examiner

F I G. 1
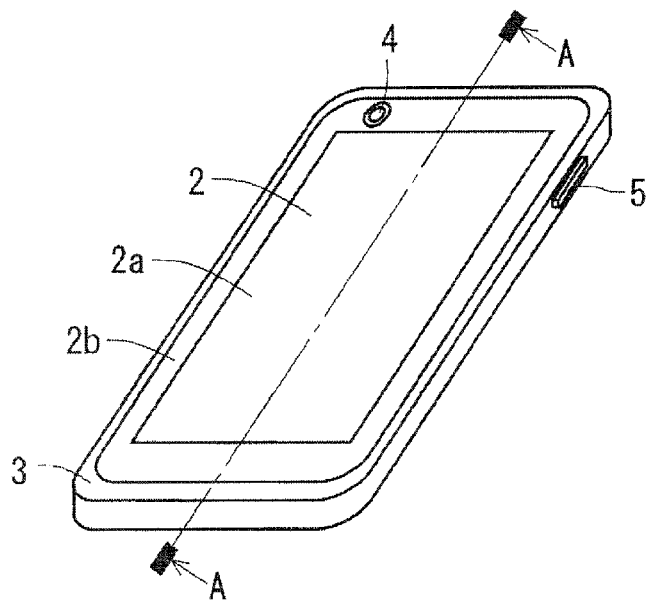
F I G. 2
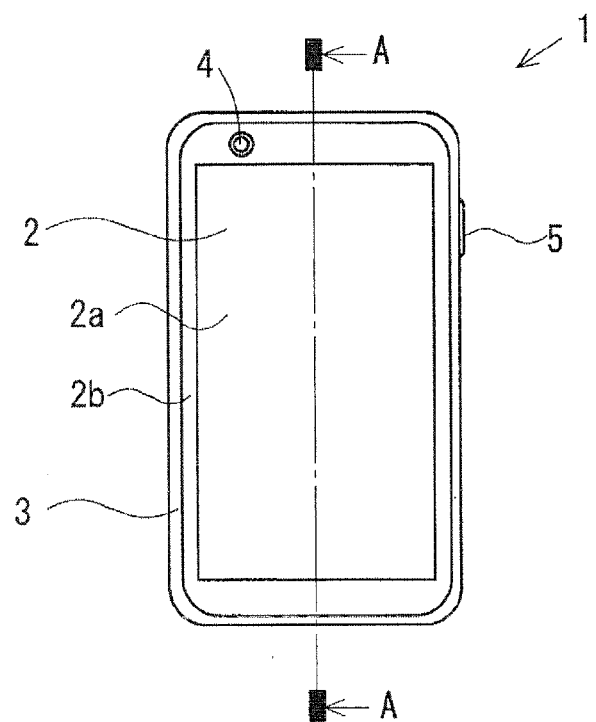

F I G . 5
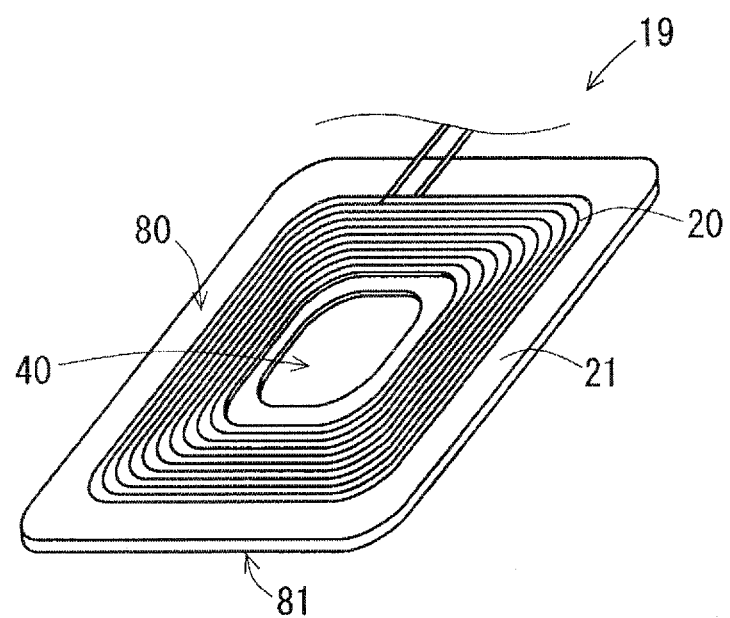
F I G . 6
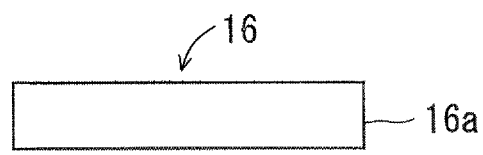

F I G . 1 2
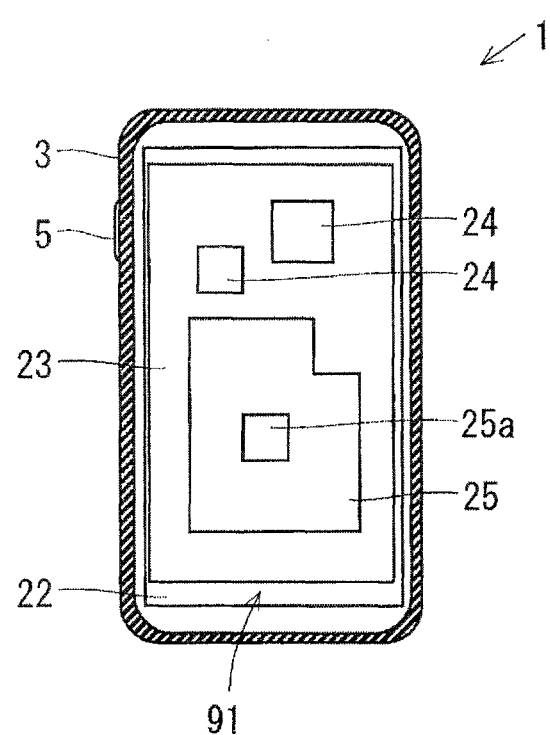

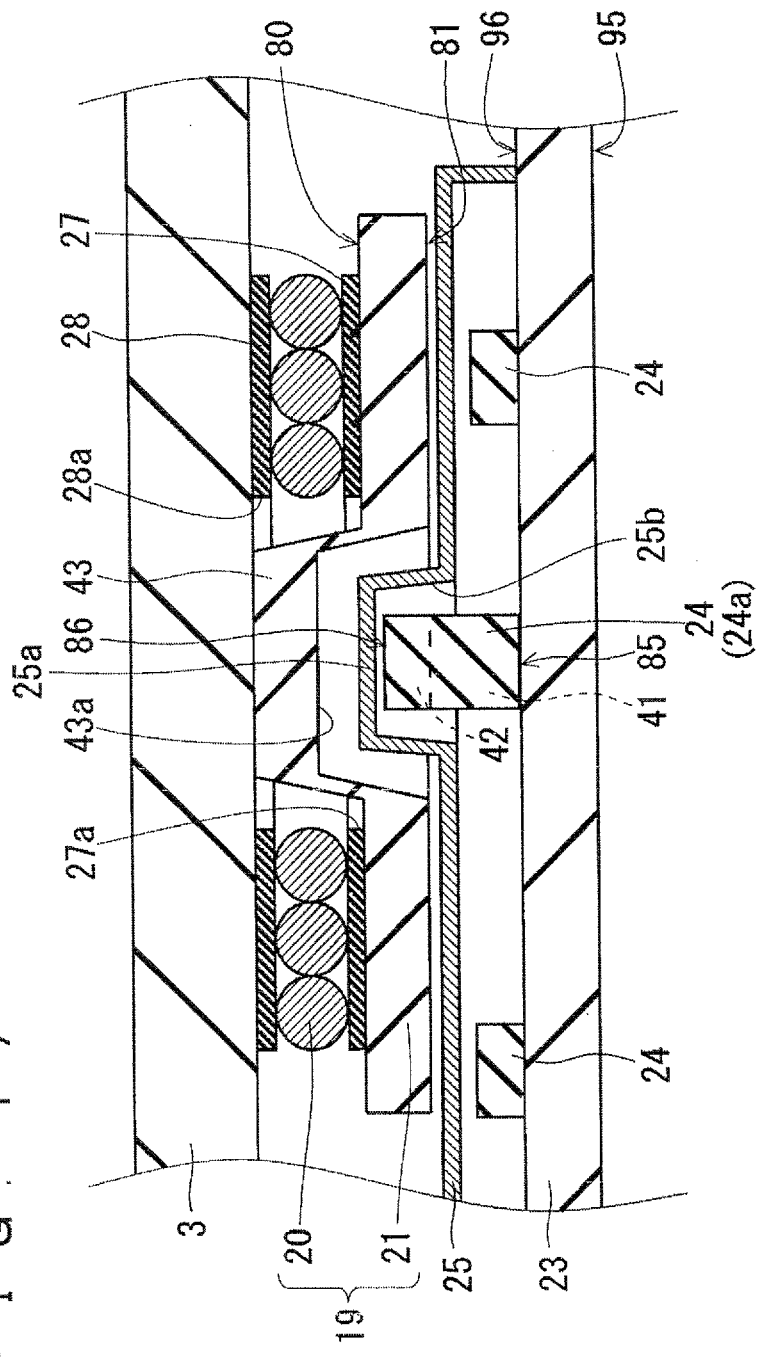

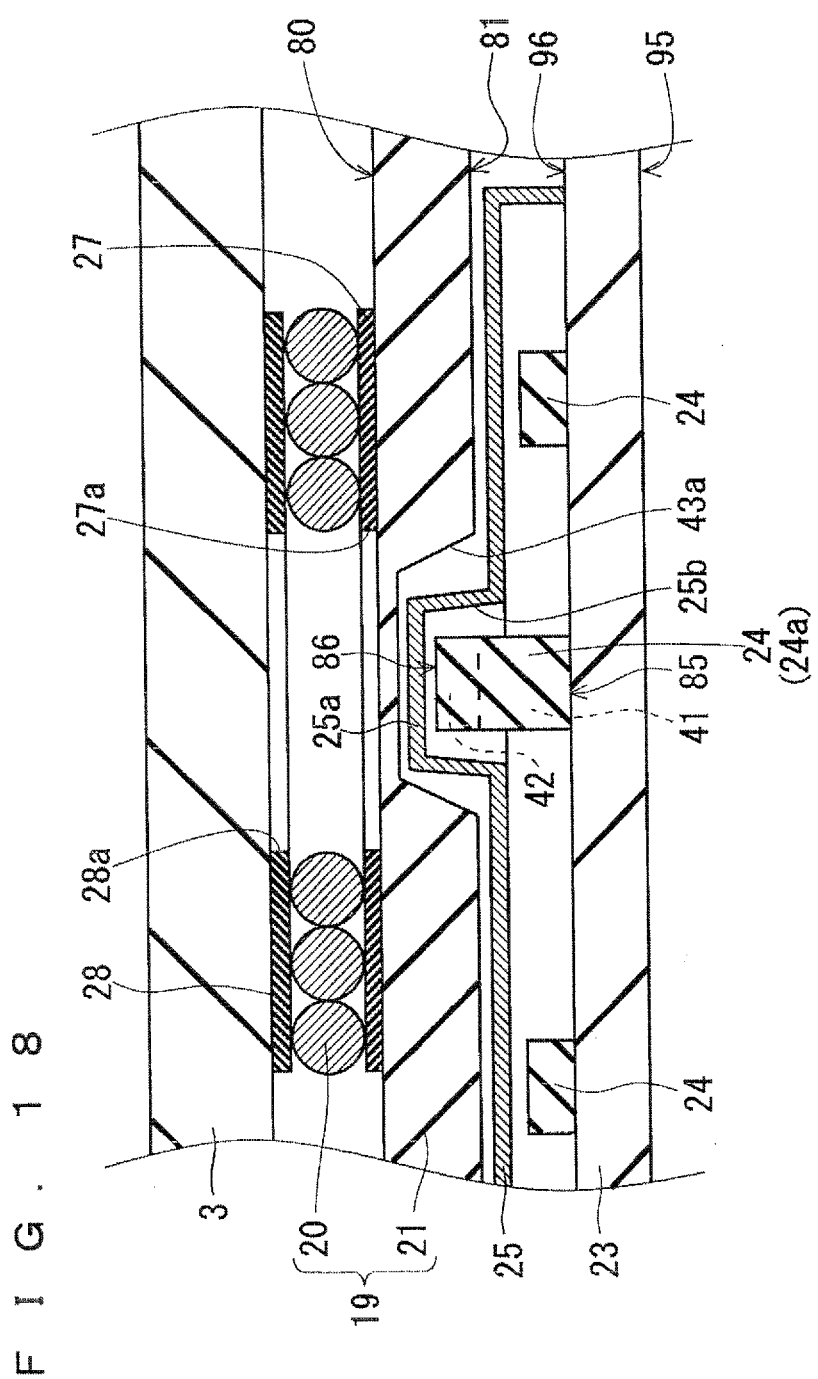

ELECTRONIC DEVICE

CROSS-REFERENCE TO RELATED APPLICATION

The present application is a continuation based on PCT Application No. PCT/JP2015/059296 filed on Mar. 26, 2015, which claims the benefit of Japanese Application No. 2014-064188, filed on Mar. 26, 2014. PCT Application No. PCT/JP2015/059296 is entitled "ELECTRONIC DEVICE", and Japanese Application No. 2014-064188 is entitled "ELECTRONIC DEVICE". The contents of which are incorporated by reference herein in their entirety.

FIELD

Embodiments of the present disclosure relate to an electronic device.

BACKGROUND

Various technologies have conventionally been proposed for electronic devices including coils.

SUMMARY

An electronic device is disclosed. In one embodiment, an electronic device comprises a first magnetic sheet, a coil, and a board. The first magnetic sheet has a first surface and a second surface opposite to the first surface. The coil is located on the first surface. The board has a third surface facing the second surface and has a first component on the third surface. The first magnetic sheet has a through hole that penetrates therethrough from the first surface to the second surface in a region of the first surface, the region being surrounded by the coil. The first component has a first portion facing the through hole.

BRIEF DESCRIPTION OF THE DRAWINGS

FIG. 1 illustrates a perspective view showing an external appearance of an electronic device.

FIG. 2 illustrates a front view showing the external appearance of the electronic device.

FIG. 5 illustrates a view of one example of an external appearance of a noncontact charger.

FIG. 6 illustrates a top view showing a structure of a piezoelectric vibrating element.

FIG. 12 illustrates a view for describing the inside of the electronic device.

FIG. 17 illustrates a cross-sectional view of the electronic device.

FIG. 18 illustrates a cross-sectional view of the electronic device.

DETAILED DESCRIPTION

<External Appearance of Electronic Device>

Figure 3:
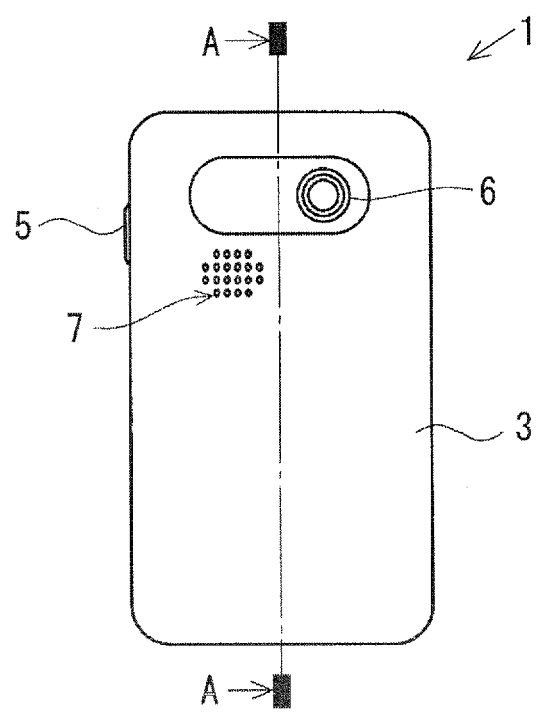
FIG. 3 illustrates a back view showing the external appearance of the electronic device.

FIGS. 1 to 3 respectively illustrate a perspective view, a front view, and a back view showing an external appearance of an electronic device 1. The electronic device 1 is, for example, a mobile phone such as a smartphone and is capable of communicating with another communication device via a base station and a server. As illustrated in FIGS. 1 and 2, the electronic device 1 has a substantially rectangular plate shape in plan view. As illustrated in FIGS. 1 to 3, a cover panel 2 and a case 3 form the exterior of the electronic device 1.

The cover panel 2 has a substantially rectangular plate shape in plan view. As illustrated in FIGS. 1 and 2, the cover panel 2 forms a front portion of the electronic device 1 except for a peripheral portion of the front portion. The cover panel 2 has a first main surface 70 forming part of the front of the electronic device 1 and a second main surface 71 located opposite to the first main surface 70 (see FIG. 11 described below). Hereinafter, the first main surface 70 may be referred to as an "outer main surface 70", and the second main surface 71 may be referred to as an "inner main surface 71".

The cover panel 2 is made of a transparent hard material. For example, transparent sapphire, transparent glass, or transparent acrylic resin may be used as a material for the cover panel 2. The cover panel 2 has a display region 2a and a peripheral region 2b. Various pieces of information such as letters, symbols, figures, and videos displayed by a display, which will be described below, are visually identified by a user through the display region 2a of the cover panel 2. The peripheral region 2b surrounding the display region 2a of the cover panel 2 is black because of, for example, a film bonded to the peripheral region 2b. Thus, a display by the display is not easily visually identified by the user through the peripheral region 2b.

A front imaging unit 4 is located in an upper end portion of the cover panel 2. A touch panel described below is bonded to the inner main surface 71 of the cover panel 2. The user can provide various instructions to the electronic device 1 by operating the display region 2a of the cover panel 2 with a finger or the like.

The case 3 forms the peripheral portion of the front portion, a side portion, and a back portion of the electronic device 1. The case 3 is made of resin, for example. For example, polycarbonate resin, ABS resin, or nylon resin is used as the resin for forming the case 3. The case 3 may comprise only one member, or may comprise a combination of a plurality of members.

An operation key 5 is located on the side portion of the electronic device 1. The operation key 5 is pushed down by the user to start the electronic device 1, for example. A back imaging unit 6 and speaker holes 7 are formed in the back of the electronic device 1.

<Electrical Configuration of Electronic Device>

Figure 4:
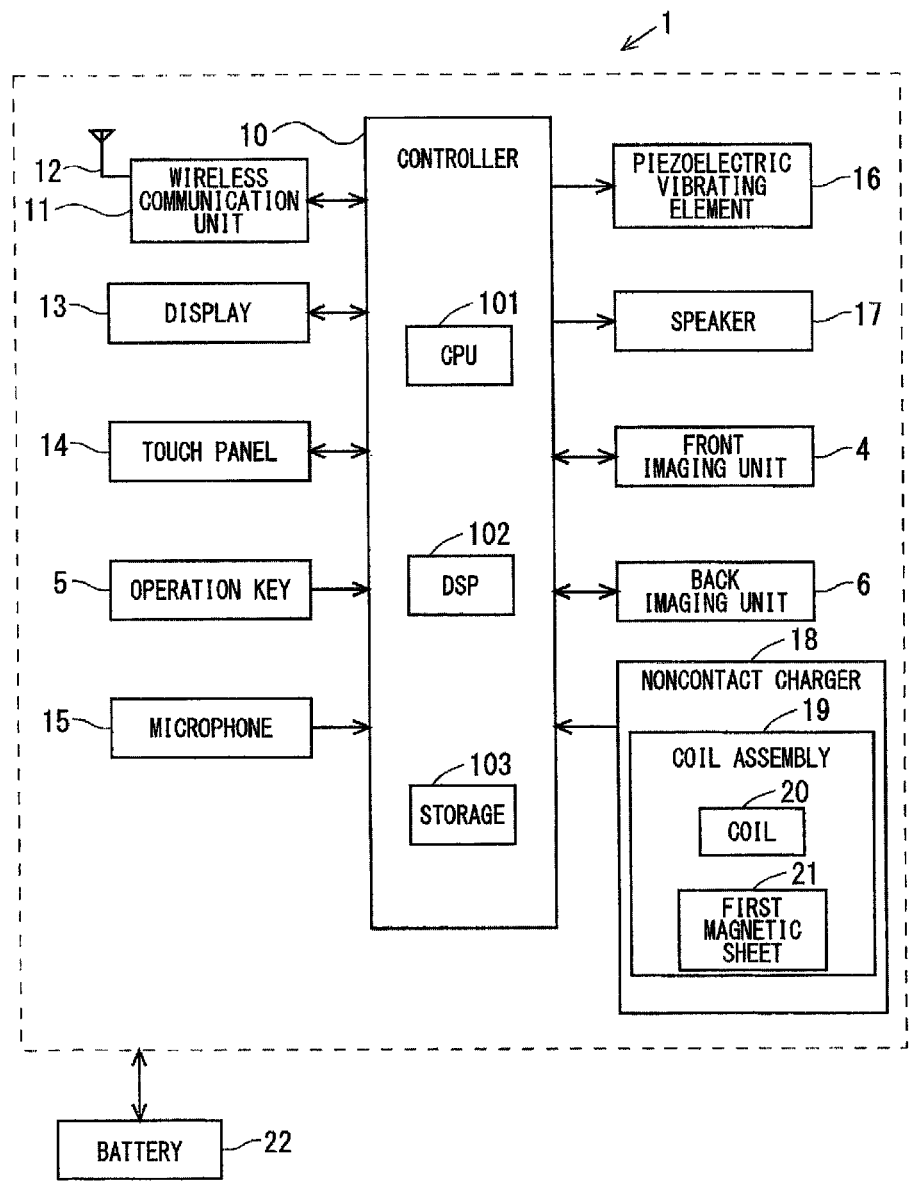
FIG. 4 illustrates a block diagram showing an electrical configuration of the electronic device.

FIG. 4 illustrates a block diagram showing an electrical configuration of the electronic device 1. As illustrated in FIG. 4, the electronic device 1 comprises a controller 10, a wireless communication unit 11, a display 13, a touch panel 14, the operation key 5, a microphone 15, a piezoelectric vibrating element 16, a speaker 17, the front imaging unit 4, the back imaging unit 6, a noncontact charger 18, and a battery 22. The structural elements of the electronic device 1 are housed in the case 3 of the electronic device 1.

The controller 10 includes a central processing unit (CPU) 101, a digital signal processor (DSP) 102, and a storage 103. The controller 10 can collectively manage the action of the electronic device 1 by controlling the other structural elements of the electronic device 1. The storage 103 includes a read only memory (ROM) and a random access memory (RAM). The storage 103 can store a plurality of application programs and a main program that is a control program for controlling the electronic device 1, and specifically, a control program for controlling each of the structural elements such as the wireless communication unit 11 and the display 13 of the electronic device 1. Various functions of the controller 10 are achieved by the CPU 101 and the DSP 102 that execute various programs in the storage 103.

The wireless communication unit 11 includes an antenna 12. The wireless communication unit 11 can transmit and receive communication signals to and from a mobile phone other than the electronic device 1 or a communication device such as a web server connected to the Internet by using the antenna 12 via the base station.

The display 13 includes, for example, a liquid crystal display or an organic electro luminescent (EL) display. As described above, various pieces of information displayed by the display 13 are visually identified from the outside of the electronic device 1 through the display region 2a.

The touch panel 14 is a projected capacitive touch panel, for example. The touch panel 14 is bonded to the inner main surface 71 of the cover panel 2. The touch panel 14 includes two electrode sensors that have a sheet shape and face each other. When the user contacts the display region 2a with an operator such as a finger, capacitance of a portion of the touch panel 14 facing the operator can be changed. Then, the touch panel 14 can output an electrical signal according to the change in the capacitance to the controller 10. In this manner, the touch panel 14 can detect contact of the operator with the display region 2a.

The operation key 5 when being pushed down can output an electrical instruction signal to the controller 10. A voice of the user during a phone call is input to the microphone 15 that can convert the input sound into an electrical signal to output the electrical signal to the controller 10.

The piezoelectric vibrating element 16 is bonded to the inner main surface 71 of the cover panel 2. The piezoelectric vibrating element 16 can be vibrated by a drive voltage applied by the controller 10. The controller 10 can generate a drive voltage based on a sound signal and apply the drive voltage to the piezoelectric vibrating element 16. The piezoelectric vibrating element 16 vibrates based on the sound signal from the controller 10, so that the cover panel 2 vibrates based on the sound signal. As a result, a reception sound is transmitted from the cover panel 2 to the user. The volume of the reception sound is set to a degree such that the user can appropriately hear the sound when moving the cover panel 2 close to an ear. The details of the piezoelectric vibrating element 16 and the reception sound transmitted from the cover panel 2 to the user will be described below in detail.

Although the piezoelectric vibrating element 16 transmits the reception sound from the cover panel 2 to the user in the following description, a dynamic speaker that converts an electrical sound signal from the controller 10 into a sound to output the sound, for example, may be used instead of the piezoelectric vibrating element 16. For the dynamic speaker, a receiver hole is formed in the cover panel 2 or the case 3. A sound output from the dynamic speaker is output to the outside through the receiver hole. The volume of the sound output through the receiver hole is lower than the volume of the sound output through the speaker holes 7.

The speaker 17 converts an electrical sound signal input from the controller 10 into a sound to output the sound, so that the speaker 17 can provide a ringer to the user located at a distance from the electronic device 1. The front imaging unit 4 and the back imaging unit 6 can capture still images and moving images.

The noncontact charger 18 can charge the battery 22 based on power supplied from the outside of the electronic device 1. The noncontact charger 18 includes a coil assembly 19. The coil assembly 19 includes a coil 20 and a first magnetic sheet 21. The noncontact charger 18 can accumulate power generated in the coil 20 by electromagnetic induction generated between the coil 20 and a coil of a charger of a device other than the electronic device 1. The noncontact charger 18 can charge the battery 22 by supplying the accumulated power to the battery 22.

The first magnetic sheet 21 is provided for improving transmission efficiency during charge time. The first magnetic sheet 21 can suppress a leakage of magnetic flux through the coil 20 to the outside. To improve the transmission efficiency of power, the coil assembly 19 is located close to the coil of the charger during charge time. For example, the coil assembly 19 is bonded to the inside of the case 3.

FIG. 5 illustrates one example of the coil assembly 19. As illustrated in FIG. 5, the coil 20 is formed of a conductor wire wound in a spiral. The coil 20 according to one embodiment has a substantially square shape whose one side is 37 mm by being made from a dozen turns or so of the conductor wire on a plane, for example. The conductor wire is not wound in a substantially square region whose one side is 19 mm in the central portion of the coil 20. The conductor wire used for forming the coil 20 has a wire diameter of 0.15 to 0.3 mm, for example. The coil 20 may be formed of a bundle of a plurality of conductor wires wound in the spiral instead of being formed of one conductor wire wound in the spiral as illustrated in FIG. 5. The number of turns of the conductor wire, a wire diameter of the conductor wire, and the number of conductor wires are appropriately selected according to product specification. The shape of the coil 20 is not limited to the substantially square shape as illustrated in FIG. 5. For example, the coil 20 may have a circular shape.

The first magnetic sheet 21 has a substantially square shape as illustrated in FIG. 5. The first magnetic sheet 21 has a thickness of 0.2 to 1.0 mm, for example. The first magnetic sheet 21 has a first main surface 80 and a second main surface 81 located opposite to the first main surface 80. The coil 20 is bonded to the first main surface 80 of the first magnetic sheet 21 with an adhesive sheet such as a double-sided tape.

The first magnetic sheet 21 has a through hole 40 that penetrates therethrough from the first main surface 80 to the second main surface 81. As illustrated in FIG. 5, the through hole 40 is formed in the region surrounded by the coil 20 bonded to the first main surface 80.

In one embodiment, one example of the coil 20 and the first magnetic sheet 21 used for charging the battery 22 in a noncontact manner is described. However, the coil 20 and the first magnetic sheet 21 may be used for another purpose. For example, the coil 20 and the first magnetic sheet 21 may be used for short distance wireless communication that transmits information with radio frequency identification (RFID).

The battery 22 accumulates power supplied from the noncontact charger 18. The power accumulated in the battery 22 is output as power supply of the electronic device 1 to each of electronic components included in the controller 10 and the wireless communication unit 11 of the electronic device 1.

<Details of Piezoelectric Vibrating Element>

Figure 7:
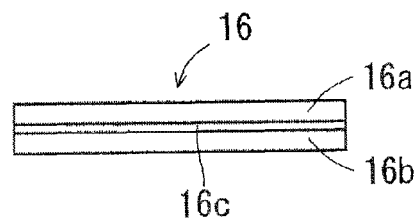
FIG. 7 illustrates a side view showing the structure of the piezoelectric vibrating element.

FIGS. 6 and 7 respectively illustrate a top view and a side view showing a structure of the piezoelectric vibrating element 16. As illustrated in FIGS. 6 and 7, the piezoelectric vibrating element 16 has a long shape in one direction. Specifically, the piezoelectric vibrating element 16 has a long and narrow rectangular plate shape in plan view. The piezoelectric vibrating element 16 has, for example, a bimorph structure. The piezoelectric vibrating element 16 includes a first piezoelectric ceramic plate 16a and a second piezoelectric ceramic plate 16b that are bonded to each other with a shim material 16c therebetween. In one embodiment, the piezoelectric vibrating element including the first piezoelectric ceramic plate 16a and the second piezoelectric ceramic plate 16b is used, but a configuration of the piezoelectric vibrating element is not limited to this specific example. For example, a piezoelectric vibrating element that includes a piezoelectric plate made of an organic piezoelectric material such as polyvinylidene difluoride and polylactic acid may be used.

In the piezoelectric vibrating element 16, when a positive voltage is applied to the first piezoelectric ceramic plate 16a and a negative voltage is applied to the second piezoelectric ceramic plate 16b, the first piezoelectric ceramic plate 16a extends in the longitudinal direction and the second piezoelectric ceramic plate 16b contracts in the longitudinal direction. Accordingly, as illustrated in FIG. 8, the piezoelectric vibrating element 16 is bent into a convex shape with the first piezoelectric ceramic plate 16a on the outside.

In contrast, in the piezoelectric vibrating element 16, when a negative voltage is applied to the first piezoelectric ceramic plate 16a and a positive voltage is applied to the second piezoelectric ceramic plate 16b, the first piezoelectric ceramic plate 16a contracts in the longitudinal direction and the second piezoelectric ceramic plate 16b extends in the longitudinal direction. Accordingly, as illustrated in FIG. 9, the piezoelectric vibrating element 16 is bent into a convex shape with the second piezoelectric ceramic plate 16b on the outside.

Figure 8:
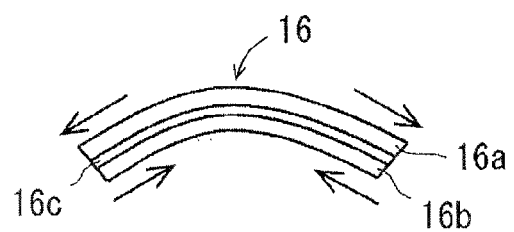
FIG. 8 illustrates how the piezoelectric vibrating element vibrates while being bent.
Figure 9:
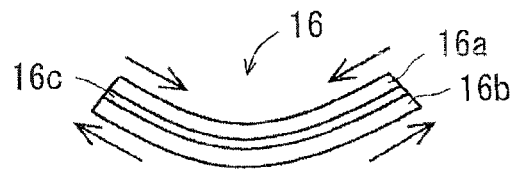
FIG. 9 illustrates how the piezoelectric vibrating element vibrates while being bent.

The piezoelectric vibrating element 16 vibrates while being bent by alternately taking the state of FIG. 8 and the state of FIG. 9. The controller 10 applies an alternating current voltage in which the positive voltage and the negative voltage alternately appear at an area between the first piezoelectric ceramic plate 16a and the second piezoelectric ceramic plate 16b, to thereby allow the piezoelectric vibrating element 16 to vibrate while being bent.

The piezoelectric vibrating element 16 illustrated in FIGS. 6 to 9 has only one structure that includes the first piezoelectric ceramic plate 16a and the second piezoelectric ceramic plate 16b bonded to each other with the shim material 16c therebetween, but the piezoelectric vibrating element 16 may have a plurality of the structures laminated to each other.

The piezoelectric vibrating element 16 having such a structure is located on a peripheral end portion of the inner main surface 71 of the cover panel 2. Specifically, the piezoelectric vibrating element 16 is located in the central portion in the lateral direction (horizontal direction) in an upper end portion of the inner main surface 71 of the cover panel 2. The piezoelectric vibrating element 16 is located such that the longitudinal direction thereof extends along the lateral direction of the cover panel 2. Thus, the piezoelectric vibrating element 16 vibrates while being bent along the lateral direction of the cover panel 2. The center of the piezoelectric vibrating element 16 in the longitudinal direction coincides with the center of the upper end portion of the inner main surface 71 of the cover panel 2 in the lateral direction.

As illustrated in FIGS. 8 and 9 described above, the piezoelectric vibrating element 16 vibrating while being bent has the greatest amount of displacement in the center thereof in the longitudinal direction. Therefore, the center of the piezoelectric vibrating element 16 in the longitudinal direction coincides with the center of the upper end portion of the inner main surface 71 of the cover panel 2 in the lateral direction, so that the location, which has the greatest amount of displacement, of the piezoelectric vibrating element 16 vibrating and being bent coincides with the center of the upper end portion of the inner main surface 71 of the cover panel 2 in the lateral direction.

<Generation of Reception Sound>

In the electronic device 1 according to one embodiment, the piezoelectric vibrating element 16 causes the cover panel 2 to vibrate, so that air conduction sound and conduction sound are transmitted from the cover panel 2 to the user. In other words, a vibration of the piezoelectric vibrating element 16 itself is transmitted to the cover panel 2, so that the air conduction sound and the conduction sound are transmitted from the cover panel 2 to the user.

Here, the term "air conduction sound" means a sound recognized in the human brain by the vibration of an eardrum due to a sound wave (air vibration) which enters an external auditory meatus hole (a so-called "ear hole"). On the other hand, the term "conduction sound" is a sound recognized in the human brain by the vibration of the eardrum due to the vibration of an auricle transmitted to the ear drum. Hereinafter, the air conduction sound and the conduction sound will be described in detail.

Figure 10:
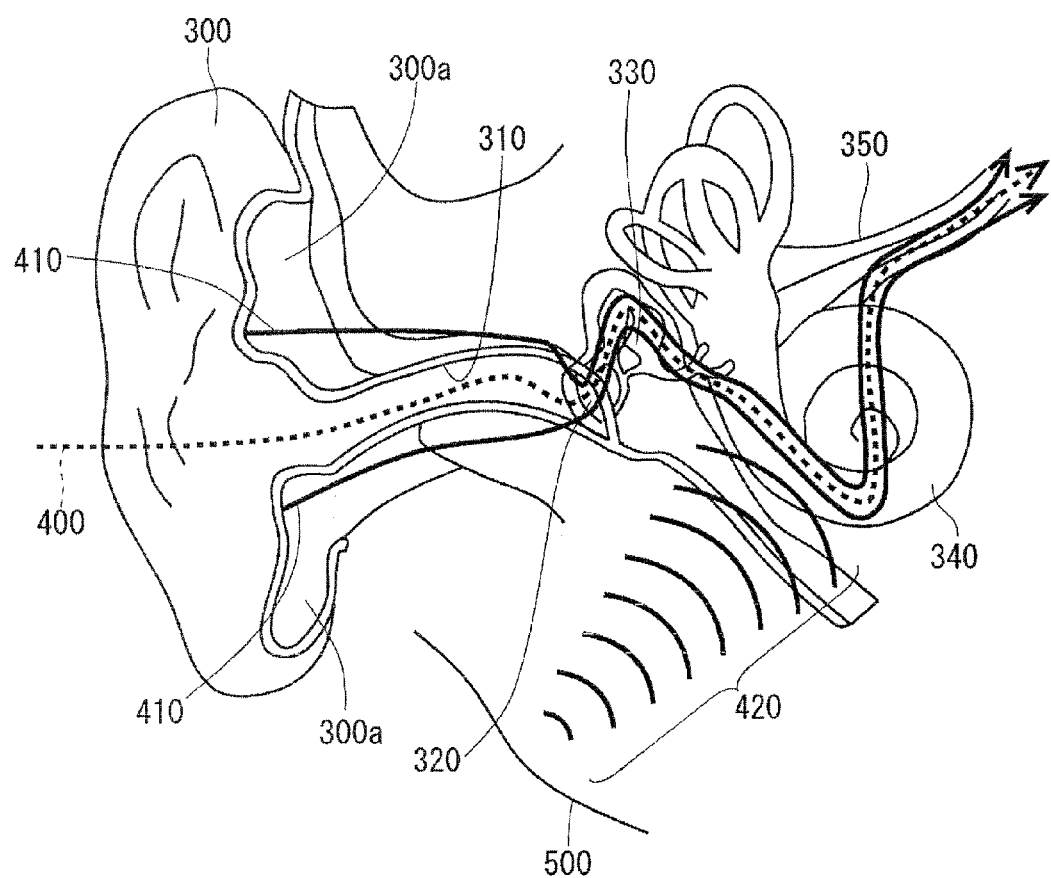
FIG. 10 illustrates a view for describing air conduction sound and conduction sound.

FIG. 10 illustrates a view for describing the air conduction sound and the conduction sound. FIG. 10 illustrates the structure of the ear of the user of the electronic device 1. In FIG. 10, a dotted line 400 indicates a conduction path of a sound signal (sound information) of the air conduction sound recognized in the brain. A solid line 410 indicates the conduction path of the sound signal of the conduction sound recognized in the brain.

When the piezoelectric vibrating element 16 mounted on the cover panel 2 vibrates based on the electric sound signal indicating the reception sound, the cover panel 2 vibrates and a sound wave is output from the cover panel 2. When the user moves the cover panel 2 of the electronic device 1 close to an auricle 300 of the user by holding the electronic device 1 in a hand, or the cover panel 2 of the electronic device 1 is set to (brought into contact with) the auricle 300 of the user, the sound wave output from the cover panel 2 enters an external auditory meatus hole 310. The sound wave from the cover panel 2 travels through the external auditory meatus hole 310 and causes an eardrum 320 to vibrate. The vibration of the eardrum 320 is transmitted to an auditory ossicle 330, and the auditory ossicle 330 vibrates. Then, the vibration of the auditory ossicle 330 is transmitted to a cochlea 340 and is converted into an electrical signal in the cochlea 340. The electrical signal is transmitted to the brain by passing through an acoustic nerve 350, and the reception sound is recognized in the brain. In this manner, the air conduction sound is transmitted from the cover panel 2 to the user.

Further, when the user puts the cover panel 2 of the electronic device 1 to the auricle 300 of the user by holding the electronic device 1 in the hand, the auricle 300 is vibrated by the cover panel 2, which is vibrated by the piezoelectric vibrating element 16. The vibration of the auricle 300 is transmitted to the eardrum 320, and thus the eardrum 320 vibrates. The vibration of the eardrum 320 is transmitted to the auditory ossicle 330, and thus the auditory ossicle 330 vibrates. The vibration of the auditory ossicle 330 is transmitted to the cochlea 340 and is converted into an electrical signal in the cochlea 340. The electrical signal is transmitted to the brain by passing through the acoustic nerve 350, and the reception sound is recognized in the brain. In this manner, the conduction sound is transmitted from the cover panel 2 to the user. FIG. 10 also illustrates an auricle cartilage 300a inside the auricle 300.

Bone conduction sound is a sound recognized in the human brain by the vibration of the skull and direct stimulation of the inner ear such as the cochlea caused by the vibration of the skull. In FIG. 10, in a case where a jawbone 500 is vibrated, the transmission path of the sound signal while the bone conduction sound is recognized in the brain is indicated with a plurality of arcs 420.

As described above, in one embodiment, the air conduction sound and the conduction sound can be transmitted from the cover panel 2 to the user of the electronic device 1 by the piezoelectric vibrating element 16 causing an appropriate vibration of the cover panel 2 located in front of the piezoelectric vibrating element 16. The user can hear the air conduction sound from the cover panel 2 by moving the cover panel 2 close to an ear (auricle). Further, the user can hear the air conduction sound and the conduction sound from the cover panel 2 by bringing the cover panel into contact with an ear (auricle). The structure of the piezoelectric vibrating element 16 according to one embodiment is contrived so as to appropriately transmit the air conduction sound and the conduction sound to the user. Various advantages are achieved by configuring the electronic device 1 to transmit the air conduction sound and the conduction sound to the user.

For example, since the user can hear a sound when putting the cover panel 2 to the ear, communication can be performed without much concerning of the position of the electronic device 1 with respect to the ear.

If there is a large amount of ambient noise, the user can make it difficult to hear the ambient noise by strongly putting the cover panel 2 to the ear while turning up the volume of the conduction sound. Thus, the user can appropriate perform communication even when there is a large amount of the ambient noise.

Moreover, even with ear plugs or earphones on his or her ears, the user can recognize the reception sound from the electronic device 1 by putting the cover panel 2 to the ear (more specifically, the auricle). Further, even when headphones on his or her ears, the user can recognize the reception sound from the electronic device 1 by putting the cover panel 2 to the headphones.

<Section of Electronic Device>

Figure 11:
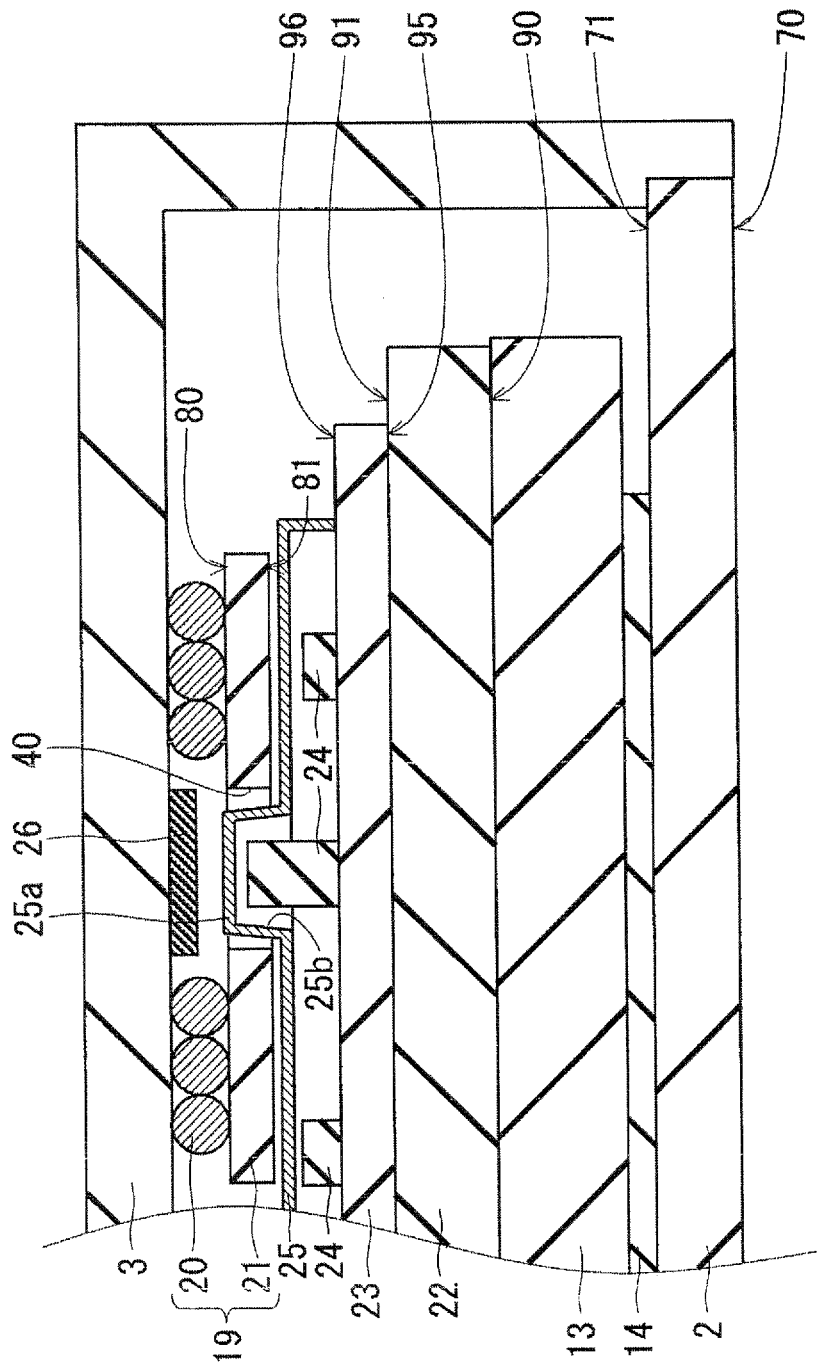
FIG. 11 illustrates a cross-sectional view of the electronic device.

Herein, an internal structure of the electronic device 1 is described. FIG. 11 illustrates a cross-sectional view of the electronic device 1 taken along an arrow A-A illustrated in FIGS. 1 to 3. FIG. 11 illustrates a cross-sectional view of the electronic device 1 with the surface facing downward. Some components of the electronic device 1 such as a plurality of cables for electrically connecting a plurality of electronic components to each other are omitted from FIG. 11 for the sake of brevity.

As illustrated in FIG. 11, the touch panel 14 is bonded to the inner main surface 71 of the cover panel 2 with a double-sided tape or an adhesive. The display 13 is located on the touch panel 14. Thus, the display 13 faces the cover panel 2 and the touch panel 14. The battery 22 is located on a back surface (surface of the display 13 opposite to the surface thereof on the touch panel 14 side). The battery 22 has a first main surface 90 facing the display 13 and a second main surface 91 opposite to the first main surface 90. A printed board (printed wiring board) 23 has a first main surface 95 facing the second main surface 91 of the battery 22 and a second main surface 96 opposite to the first main surface 95.

The printed board 23 is located such that the first main surface 95 of the printed board 23 faces the second main surface 91 of the battery 22. A plurality of components 24 including electronic components, such as the CPU 101 and the DSP 102, are installed on the second main surface 96 of the printed board 23. No components are installed on the first main surface 95 of the printed board 23. Thus, the components 24 on the printed board 23 are located opposite to the battery. The printed board 23 is electrically connected to the electronic components of the electronic device 1 with cables, which are not shown. In one example illustrated in FIG. 11, the printed board 23 is connected to the touch panel 14, the display 13, the battery 22, and the noncontact charger 18 with the cables.

As illustrated in FIG. 11, a shield plate 25 covers each of the components 24 on the printed board 23. The shield plate 25 is made of metal, for example, and mounted on the printed board 23. The shield plate 25 is electrically connected to ground wiring on the printed board 23. The shield plate 25 is used for shielding noise emitted from the components 24 installed on the printed board 23 and dissipating heat generated from the components 24 installed on the printed board 23, for example.

The shield plate 25 has a protruding portion 25a that covers at least one of the plurality of components 24 installed on the printed board 23. The protruding portion 25a is formed in the shield plate 25 such that a recessed portion 25b is formed in the main surface of the shield plate 25 on the printed board 23 side. Thus, at least one of the plurality of components 24 is located inside the recessed portion 25b. One embodiment gives description of one example in which the electronic device 1 includes the shield plate 25, but the electronic device 1 may not necessarily include the shield plate 25.

FIG. 12 illustrates a view for describing the internal structure of the electronic device 1. FIG. 12 illustrates the electronic device 1 when viewed from the back surface. FIG. 12 illustrates the case 3 in the cross-sectional structure to allow the internal configuration of the electronic device 1 to be seen. FIG. 12 illustrates the battery 22 and the printed board 23 located on the second main surface 91 of the battery 22. The plurality of components 24 are installed on the other main surface that does not face the battery 22. The shield plate 25 is mounted on the printed board 23 so as to cover the components 24 installed on the printed board 23. As illustrated in FIG. 12, the shield plate 25 may not cover all of the components 24 installed on the printed board 23.

Referring back to FIG. 11, the coil assembly 19 (the coil 20 and the first magnetic sheet 21) is located so as to face the printed board 23. One embodiment gives description of one example in which the coil assembly 19 is bonded to the inner surface of the case 3.

The coil 20 bonded to the first main surface 80 of the first magnetic sheet 21 is bonded, with the adhesive sheet such as the double-sided tape, to the inner surface of the case 3, and specifically, to a region of the inner surface of the case 3, the region being opposite to the back surface of the electronic device 1. The second main surface 81 of the first magnetic sheet 21 faces the printed board 23. In this manner, the coil assembly 19 (the coil 20 and the first magnetic sheet 21) is bonded to the case 3, thereby allowing the coil 20 to be located close to the coil of the charger during charge time. This can improve transmission efficiency of power. Moreover, the first magnetic sheet 21 can suppress a leakage of magnetic flux through the coil 20. This can suppress the heat generated in the battery 22 and the metal components such as the shield plate 25 due to the leakage of the magnetic flux.

As illustrated in FIG. 11, the first magnetic sheet 21 has the through hole 40. In one embodiment, the first magnetic sheet 21 has the through hole 40, to thereby prevent contact (interference) between the component 24 installed on the printed board 23 and the first magnetic sheet 21. Therefore, in the case where the electronic device 1 includes the shield plate 25 covering the components 24, the protruding portion 25a, which covers the component 24, located on the shield plate 25 prevents the contact (interference) between not only the component 24 and the first magnetic sheet 21 but also the shield plate 25 and the first magnetic sheet 21.

As illustrated in FIG. 11, a second magnetic sheet 26 facing the through hole 40 may be located on the first main surface 80 side of the first magnetic sheet 21. One embodiment gives description of one example in which the second magnetic sheet 26 similarly to the coil assembly 19 is bonded to the inner surface of the case 3. For example, the second magnetic sheet 26 is bonded to the case 3 with the adhesive sheet such as the double-bonded tape. The through hole 40 and the second magnetic sheet 26 are described below in detail.

Through Hole>

Figure 13:
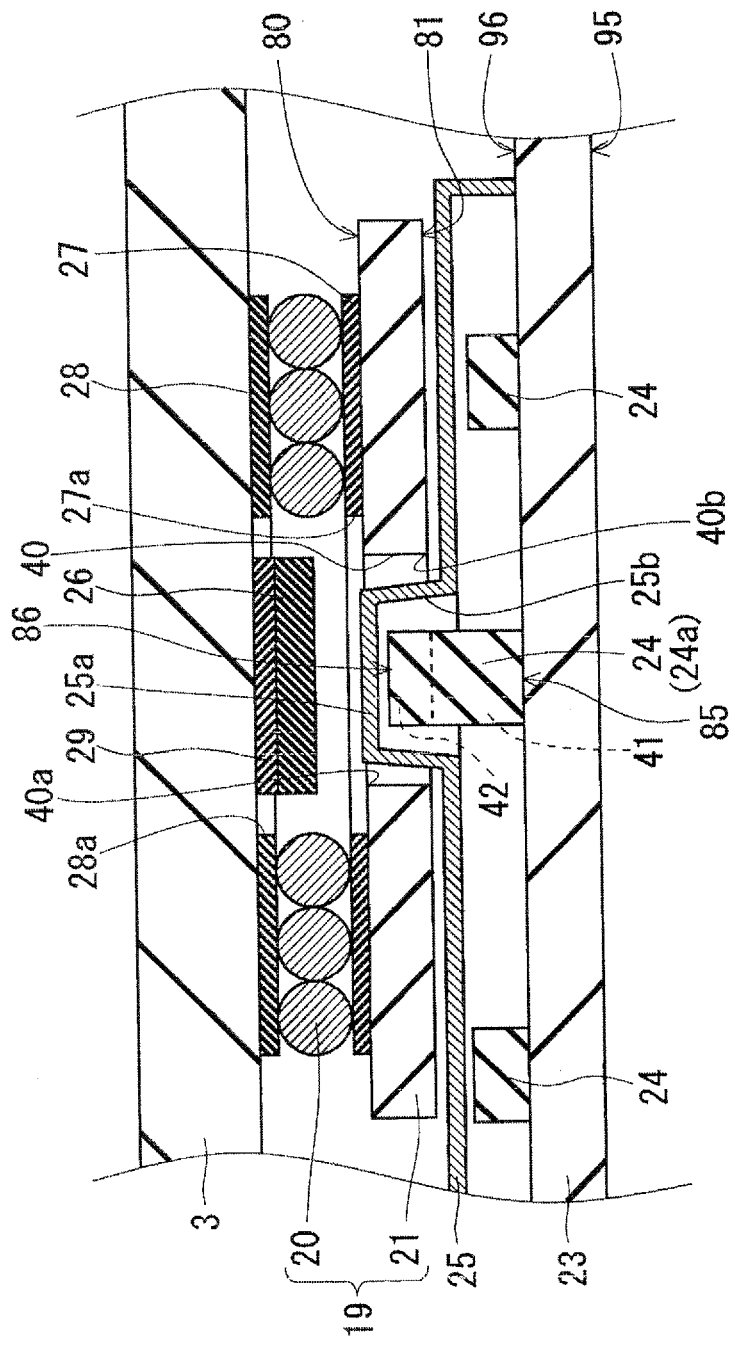
FIG. 13 illustrates a cross-sectional view of the electronic device.

FIG. 13 illustrates an enlarged view of part of the cross-sectional view illustrated in FIG. 11. FIG. 13 illustrates the case 3, the coil assembly 19, the shield plate 25, and the printed board 23. FIG. 13 illustrates an adhesive sheet 27 such as the double-sided tape for bonding the first magnetic sheet 21 to the coil 20, an adhesive sheet 28 such as the double-sided tape for bonding the coil 20 to the case 3, and an adhesive sheet 29 such as the double-sided tape for bonding the second magnetic sheet 26 to the case 3, which are omitted from FIG. 11.

As illustrated in FIG. 13, a portion of the adhesive sheet 27 for bonding the coil 20 to the first magnetic sheet 21 has a through hole 27a, the portion being surrounded by the coil 20. The through hole 27a is communicatively connected to the through hole 40 of the first magnetic sheet 21. A portion of the adhesive sheet 28 for bonding the coil 20 to the case 3 has a through hole 28a, the portion being surrounded by the coil 20. The through hole 28a faces the through hole 40 of the first magnetic sheet 21 and the through hole 27a of the adhesive sheet 27. The second magnetic sheet 26 is bonded, with the adhesive sheet 29, to a region of the inner surface of the case 3 exposed through the through hole 28a of the adhesive sheet 28.

A component 24a installed on the printed board 23 has a first portion (lower portion) 41 and a second portion (upper portion) 42. The first portion 41 faces the through hole 40 of the first magnetic sheet 21. The second portion 42 is located in space sandwiched between an opening 40a of the through hole 40 formed in the first main surface 80 (opening 40a of the through hole 40 on the first main surface 80 side) and an opening 40b of the through hole 40 formed in the second main surface 81 (opening 40b of the through hole 40 on the second main surface 81 side). In other words, the second portion 42 is located in the through hole 40.

The component 24a has a first surface 85 facing the second main surface 96 of the printed board 23 and a second surface 86 opposite to the first surface 85. As illustrated in FIG. 13, a length between the second main surface 96 of the printed board 23 and the second surface 86 of the component 24a (namely, a height of the component 24a) is longer than a length between the second main surface 96 of the printed board 23 and the second main surface 81 of the first magnetic sheet 21.

The component 24a is, for example, the tallest component of the plurality of components 24 installed on the printed board 23. The component 24a is a component on which a package on package (PoP) stacking technique is performed. For example, the CPU 101 is located in the first portion 41 of the component 24a while the RAM included in the storage 103 is located in the second portion 42 of the component 24a.

Herein, in a case where the first magnetic sheet 21 does not have the through hole 40, the tall component 24a contacts the first magnetic sheet 21 when the first magnetic sheet 21 and the printed board 23 are moved closer to each other.

In one embodiment, the first magnetic sheet 21 has the through hole 40. Thus, as illustrated in FIG. 13, the component 24a located such that the first portion (lower portion) 41 of the component 24a faces the through hole 40 can be prevented from contacting the first magnetic sheet 21 when the first magnetic sheet 21 and the printed board 23 are moved closer to each other. As a result, the electronic device 1 can be reduced in thickness.

In other words, in one embodiment, the tallest component 24a of the plurality of components 24 installed on the printed board 23 is installed on the region of the printed board 23 facing the through hole 40, to thereby prevent the contact between the component 24a and the first magnetic sheet 21.

Also in the case where the electronic device 1 includes the shield plate 25 covering each of the components 24 as illustrated in FIG. 13, the shield plate 25 has the protruding portion 25a covering the tall component 24a, which can prevent the contact between the shield plate 25 and the first magnetic sheet 21. In one example illustrated in FIG. 13, the whole of the protruding portion 25a of the shield plate 25 is located in the through hole 40, but part of the protruding portion 25a may be located in the through hole 40.

Figure 14:
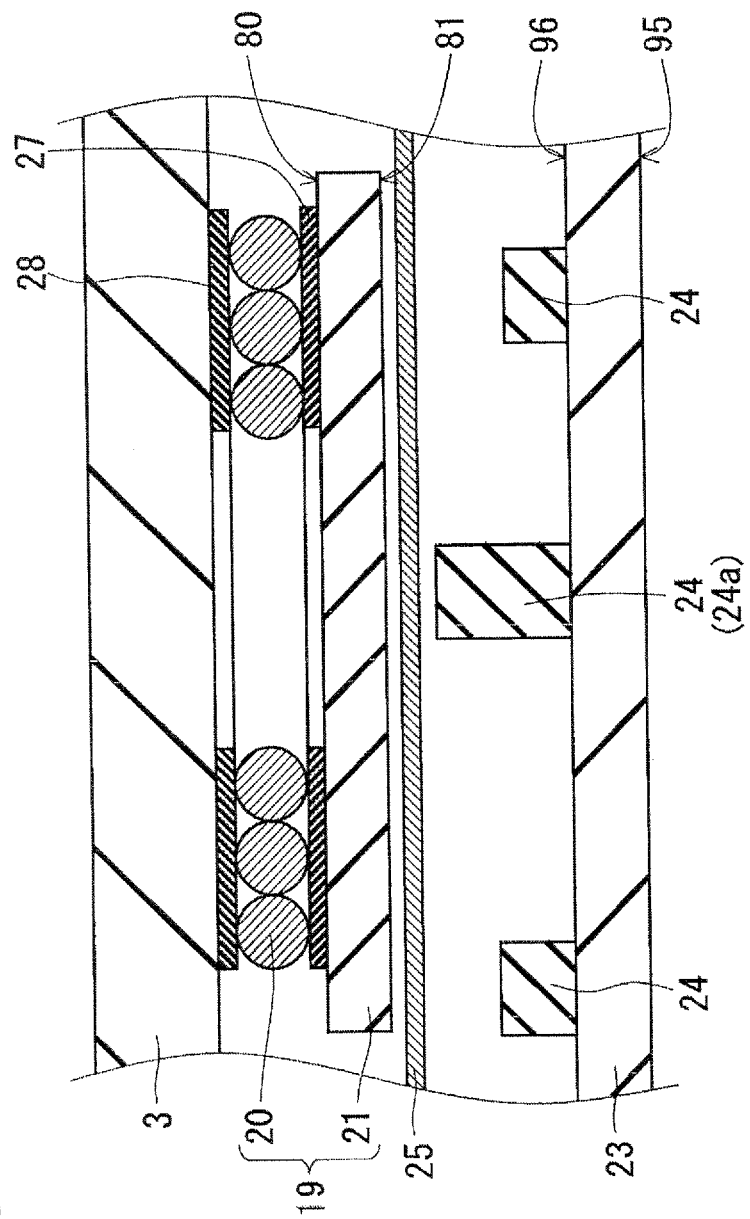
FIG. 14 illustrates a cross-sectional view of a comparative device.

FIG. 14 illustrates a cross-sectional view of an electronic device (hereinafter referred to as a "comparative device"), which is compared with the electronic device 1 in one embodiment, corresponding to the cross-sectional view of the electronic device 1 illustrated in FIG. 13.

As illustrated in FIG. 14, a first magnetic sheet 21 of the comparative device does not have a through hole 40. A shield plate 25 does not have a protruding portion 25a.

In such a comparative device, a tall component 24a and the first magnetic sheet 21 contact each other when a printed board 23 and the first magnetic sheet 21 are moved closer to each other. Therefore, in contrast to the electronic device 1 in one embodiment, the device is hardly reduced in thickness.

On the other hand, in the electronic device 1 in one embodiment, the tall component 24a has the second portion 42 located in the space sandwiched between the opening 40a of the through hole 40 on the first main surface 80 side and the opening 40b of the through hole 40 on the second main surface 81 side. In other words, the length between the second main surface 96 of the printed board 23 and the second surface 86 of the component 24a is longer than the length between the second main surface 96 of the printed board 23 and the second main surface 81 of the first magnetic sheet 21. Thus, the contact between the first magnetic sheet 21 and the component 24a can be prevented in the electronic device 1 in one embodiment. As a result, the electronic device 1 can be reduced in thickness.

In one example illustrated in FIG. 13, the component 24a that has both of the first portion 41 facing the through hole 40 and the second portion 42 located in the through hole 40 is described. However, the component 24a may not have the second portion 42 located in the through hole 40. In other words, the entire region of the component 24a may not be located in the through hole 40.

Figure 15:
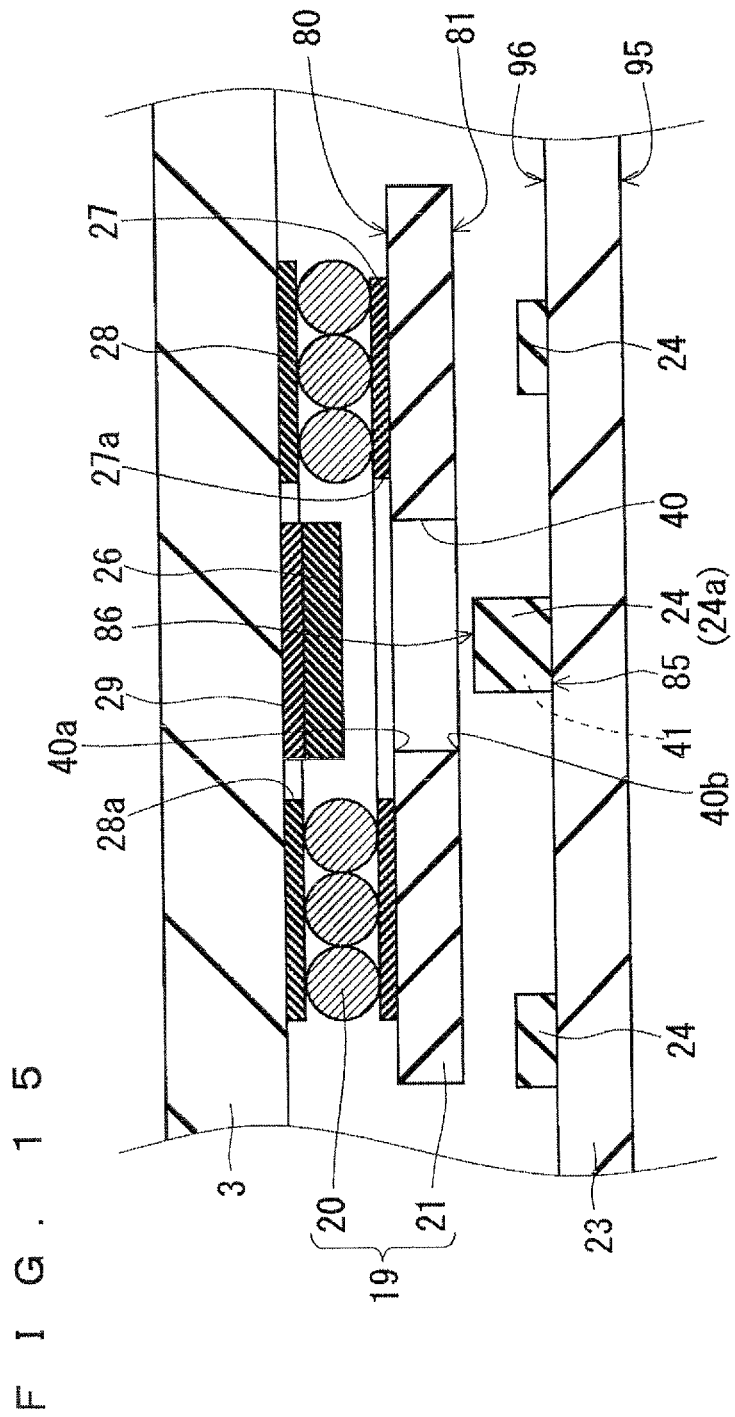
FIG. 15 illustrates a cross-sectional view of the electronic device.

FIG. 15 illustrates one example of a cross-sectional view of the electronic device 1 corresponding to the cross-sectional view illustrated in FIG. 13. FIG. 15 illustrates the electronic device 1 that does not include the shield plate 25. The component 24a illustrated in FIG. 15 is not located in the through hole 40, and the whole of the component 24a is the first portion 41 facing the through hole 40.

Herein, the printed board 23 and the shield plate 25 may be located closer to the coil assembly 19 than a design value due to assembly tolerances or the like. Further, the battery 22 may expand during charge time. Thus, the expansion of the battery 22 may cause the printed board 23 and the shield plate 25 to move closer to the coil assembly 19. Therefore, in the case where the printed board 23 and the coil assembly 19 have a short distance therebetween and part of the tall component 24a is located in the through hole 40 as in one example described above (FIG. 13), the plurality of components 24 on the printed board 23 except for the component 24a located in the through hole 40 may contact the coil assembly 19. Also in the case where the shield plate 25 is provided as in one example illustrated in FIG. 13, portions of the shield plate 25 mounted on the printed board 23 except for the protruding portion 25a located in the through hole 40 may contact the coil assembly 19.

On the other hand, in the case where the entire region of the tall component 24a is not located in the through hole 40 as in one example of FIG. 15, that is to say, the component 24a does not have the second portion 42, the distance between the printed board 23 and the coil assembly 19 can be increased. As a result, the plurality of components 24 on the printed board 23 except for the component 24a located in the through hole 40 can be prevented from contacting the coil assembly 19. In the case where the shield plate 25 is provided, the portions of the shield plate 25 except for the protruding portion 25a located in the through hole 40 can be prevented from contacting the coil assembly 19.

In one example illustrated in FIG. 13, only the tallest component 24a, which has the first portion 41 and the second portion 42, of the plurality of components 24 installed on the printed board 23 is described, but the plurality of components 24 may have the first portion 41 and the second portion 42.

Figure 16:
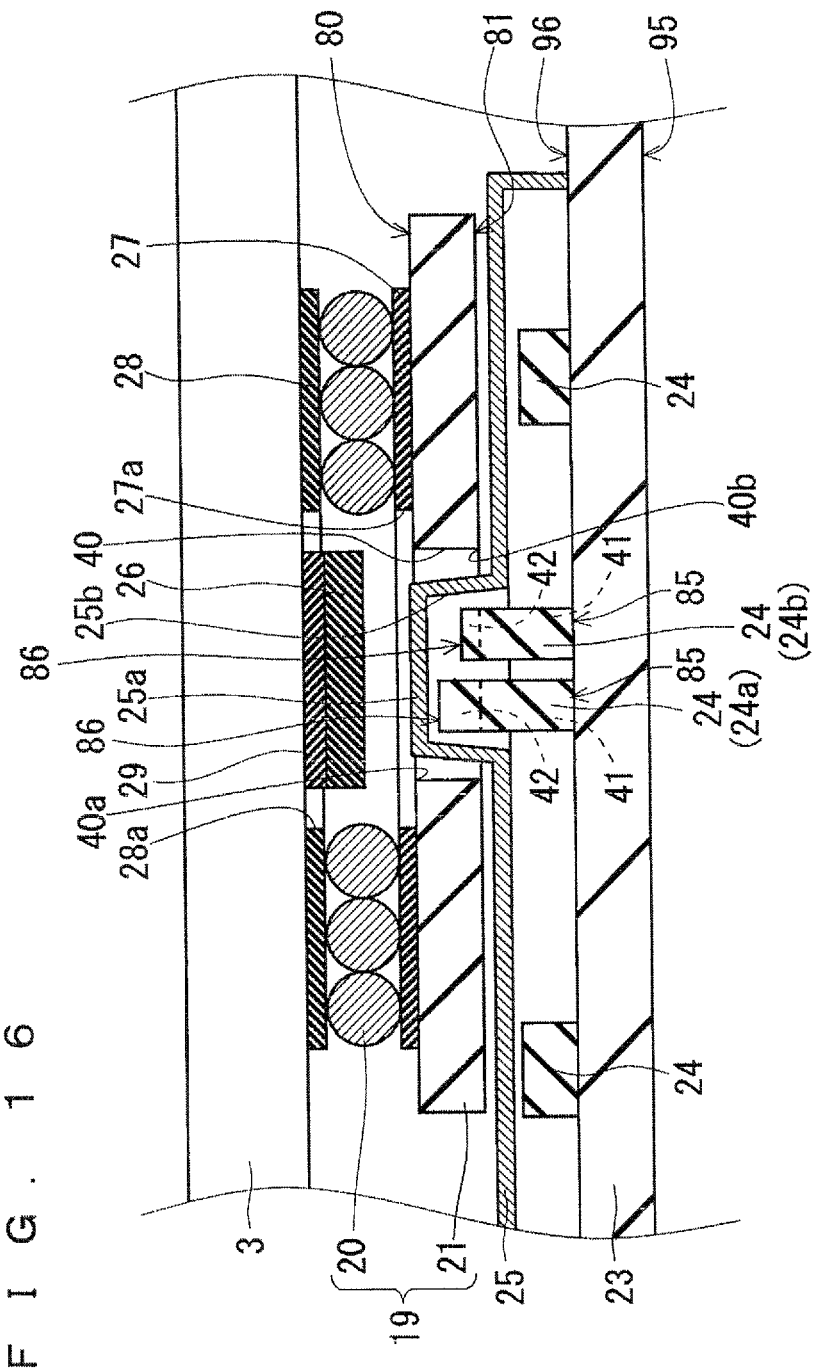
FIG. 16 illustrates a cross-sectional view of the electronic device.

FIG. 16 illustrates one example of a cross-sectional view of the electronic device 1 corresponding to the cross-sectional view illustrated in FIG. 13. In one example of FIG. 16, of the plurality of components 24, the tallest component 24a and the second tallest component 24b each have the first portion 41 and the second portion 42. In this manner, the plurality of components 24 selected in decreasing order of height among the plurality of components 24 on the printed board 23 are installed on the region of the printed board 23 facing the through hole 40, to thereby make it more difficult for the first magnetic sheet 21 and the components 24 to contact each other. As a result, the electronic device 1 can be further reduced in thickness.

As illustrated in FIG. 16, the shield plate 25 may have one protruding portion 25a that covers the component 24a and the component 24b together, or may have two protruding portions that each cover the components 24a and the component 24b.

Also in the case where the plurality of components 24 are installed on the region of the printed board 23 facing the through hole 40, the plurality of components 24 may not have the second portion 42. For example, all of the plurality of components 24 installed on the region of the printed board 23 facing the through hole 40 may not have the second portion 42, or part of the plurality of the components 24 may not have the second portion 42.

One embodiment described above gives description of the component 24a that is the tallest component 24 of the plurality of components 24 installed on the printed board 23, but the component 24a may not be the tallest component 24 of the plurality of components 24 installed on the printed board 23.

For example, in a case where the first magnetic sheet 21 has an area sufficiently smaller than an area of the printed board 23, the tallest component 24 of the plurality of components 24 installed on the printed board 23 may be located on a region of the printed board 23 that does not face the first magnetic sheet 21. Therefore, in this case, the tallest component 24 on the printed board 23 hardly contacts the first magnetic sheet 21. In such a case, of the plurality of components 24 installed on the region of the printed board 23 facing the first magnetic sheet 21, the tallest component 24 is located on the region of the printed board 23 facing the through hole 40, and thus the contact between the component 24 and the first magnetic sheet 21 can be prevented.

<Second Magnetic Sheet>

As described above, the second magnetic sheet 26 is located on the first main surface 80 side of the first magnetic sheet 21 so as to face the through hole 40. The second magnetic sheet 26 is provided for suppressing a leakage of magnetic flux through the coil 20 to the outside. The second magnetic sheet 26 located in the electronic device 1 can improve transmission efficiency of power during charge time and suppress heat generated in the battery 22 and the metal components such as the shield plate 25 due to the leakage of the magnetic flux.

The second magnetic sheet 26 is preferably thinner than the first magnetic sheet 21. The second magnetic sheet 26 has a thickness of 0.05 to 0.1 mm, for example. The second magnetic sheet 26 having a thinner thickness hardly contacts the component 24a.

It should be noted that the second magnetic sheet 26 is not necessarily thinner than the first magnetic sheet 21. For example, the first magnetic sheet 21 and the second magnetic sheet 26 may have the same thickness.

Instead of having the through hole 40, the first magnetic sheet 21 may have a protruding portion 43, which protrudes toward the coil 20, in the region surrounded by the coil 20 in a similar manner that the first magnetic sheet 21 has a recessed portion 43a in the second main surface 81, as illustrated in FIG. 17. In this case, the second magnetic sheet 26 may not be provided. In one example of FIG. 17, the component 24a has the first portion 41 facing the recessed portion 43a and the second portion 42 located in the recessed portion 43a.

Herein, the quality of a material for the magnetic sheet is often brittle or easily broken, and the magnetic sheet is often hardly bent. Therefore, the first magnetic sheet 21 is processed easier to have the through hole 40 than to have the protruding portion 25a as in one example of FIG. 17.

In addition, as illustrated in FIG. 18, the first magnetic sheet 21 may have only the second main surface 81 processed to have the recessed portion 43a in the second main surface 81 instead of having the protruding portion 43.

In the above description, the electronic device 1 is described in detail, but the above description is the exemplification in all aspects and embodiments of the present disclosure are not intended to be limited thereto. In addition, various examples described above are applicable in combination as long as they are not mutually inconsistent. And, it is construed that numerous modifications which are not exemplified can be envisaged without departing from the scope of the present disclosure.

The invention claimed is:

1. An electronic device, comprising:
a first magnetic sheet having a first surface and a second surface opposite to the first surface;
a coil located on the first surface; and
a board having a third surface facing the second surface, wherein
the board has a first component on the third surface,
the first magnetic sheet has a through hole that penetrates therethrough from the first surface to the second surface in a region of the first surface, the region being surrounded by the coil,
the first component has a first portion facing the through hole,
the electronic device further comprising a shield plate between the first magnetic sheet and the first component, and
the shield plate comprising a protruding portion covering the first component and wherein the shield plate is mounted on the board.

2. The electronic device according to claim 1, wherein
the first component has a second portion, and
the second portion is located in space sandwiched between a first opening of the through hole on the first surface side and a second opening of the through hole on the second surface side.

3. The electronic device according to claim 1, wherein
the first component has a fourth surface facing the third surface and a fifth surface opposite to the fourth surface, and
a length between the third surface and the fifth surface is longer than a length between the third surface and the second surface.

4. The electronic device according to claim 1, wherein
the board has a plurality of second components including the first component, and
the first component is the tallest component of the plurality of second components.

5. An electronic device, comprising:
a first magnetic sheet having a first surface and a second surface opposite to the first surface;
a coil located on the first surface; and
a board having a third surface facing the second surface, wherein
the board has a first component on the third surface,
the first magnetic sheet has a through hole that penetrates therethrough from the first surface to the second surface in a region of the first surface, the region being surrounded by the coil,
the first component has a first portion facing the through hole, and
the electronic device further comprising a second magnetic sheet that is located on the first surface side and faces the through hole.

6. The electronic device according to claim 5, wherein the second magnetic sheet is thinner than the first magnetic sheet.

* * * * *